US007888867B2

(12) United States Patent  
Yoshida et al.

(10) Patent No.: US 7,888,867 B2  
(45) Date of Patent: Feb. 15, 2011

(54) ORGANIC EL DEVICE HAVING BANK WITH GROOVE, ORGANIC EL DISPLAY PANEL, AND METHOD FOR MANUFACTURING THE ORGANIC EL DEVICE

(75) Inventors: Hidehiro Yoshida, Osaka (JP); Arinobu Kanegae, Chiba (JP); Shuhei Nakatani, Osaka (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/680,946

(22) PCT Filed: Dec. 25, 2008

(86) PCT No.: PCT/JP2008/003978

§ 371 (c)(1),
(2), (4) Date: Mar. 31, 2010

(87) PCT Pub. No.: WO2009/084209

PCT Pub. Date: Jul. 9, 2009

(65) Prior Publication Data

US 2010/0213827 A1  Aug. 26, 2010

(30) Foreign Application Priority Data

| Dec. 28, 2007 | (JP) | .............. 2007-339165 |
| Dec. 28, 2007 | (JP) | .............. 2007-339168 |
| Dec. 28, 2007 | (JP) | .............. 2007-339169 |
| Mar. 25, 2008 | (JP) | .............. 2008-077310 |
| Mar. 25, 2008 | (JP) | .............. 2008-077311 |
| Mar. 25, 2008 | (JP) | .............. 2008-077312 |

(51) Int. Cl.  
*H05B 33/00* (2006.01)  
*H01J 9/26* (2006.01)

(52) U.S. Cl. ............... 313/506; 313/504; 313/500; 257/98; 257/40; 445/24

(58) Field of Classification Search .............. None  
See application file for complete search history.

(56) References Cited

U.S. PATENT DOCUMENTS

| 6,388,377 | B1  |   5/2002 | Kobayashi et al. |
| 7,015,503 | B2* |   3/2006 | Seki et al. .............. 257/40 |
| 7,326,653 | B2  |   2/2008 | Gunner et al. |
| 7,477,014 | B2  |   1/2009 | Mitsuya |
| 7,710,029 | B2  |   5/2010 | Yoshida et al. |

(Continued)

FOREIGN PATENT DOCUMENTS

JP    2000-195668    7/2000

(Continued)

*Primary Examiner*—Sikha Roy  
(74) *Attorney, Agent, or Firm*—Greenblum & Bernstein P.L.C.

(57) ABSTRACT

Disclosed is an organic EL device which comprises an organic light-emitting layer having a uniform thickness even though the organic light-emitting layer is formed by a coating method. Specifically disclosed is an organic EL device comprising a substrate, an anode arranged on the substrate, an organic light-emitting layer arranged on the anode, and a bank defining an arrangement region for the organic light-emitting layer. A groove is formed on the upper surface of the bank, and the outer or inner edge of the groove defines the border of the organic light-emitting layer.

11 Claims, 13 Drawing Sheets

U.S. PATENT DOCUMENTS

| | | |
|---|---|---|
| 2005/0064648 A1 * | 3/2005 | Toyoda .................... 438/222 |
| 2005/0093441 A1 | 5/2005 | Uhlig et al. |
| 2005/0196969 A1 | 9/2005 | Gunner et al. |
| 2005/0237780 A1 | 10/2005 | Sakai |
| 2005/0285512 A1 | 12/2005 | Murayama |
| 2007/0075618 A1 | 4/2007 | Mitsuya |
| 2007/0252518 A1 | 11/2007 | Lee et al. |
| 2009/0058268 A1 | 3/2009 | Yoshida et al. |
| 2009/0160322 A1 | 6/2009 | Yoshida et al. |
| 2009/0224664 A1 | 9/2009 | Yoshida et al. |
| 2009/0272999 A1 | 11/2009 | Yoshida et al. |
| 2009/0284135 A1 | 11/2009 | Yoshida et al. |
| 2009/0284146 A1 | 11/2009 | Yoshida et al. |
| 2009/0321725 A1 | 12/2009 | Yoshida et al. |

FOREIGN PATENT DOCUMENTS

| | | |
|---|---|---|
| JP | 2000-215989 | 8/2000 |
| JP | 2000-252062 | 9/2000 |
| JP | 2003-045668 | 2/2003 |
| JP | 2005-52835 | 3/2005 |
| JP | 2005-93421 | 4/2005 |
| JP | 2005-522000 | 7/2005 |
| JP | 2005-276479 | 10/2005 |
| JP | 2006-32198 | 2/2006 |
| JP | 2006-294454 | 10/2006 |
| JP | 2007-95614 | 4/2007 |
| JP | 2007-128688 | 5/2007 |
| JP | 2009-117390 | 5/2009 |
| JP | 2009-117391 | 5/2009 |
| JP | 2009-117392 | 5/2009 |
| JP | 2009-123714 | 6/2009 |
| JP | 4280301 | 6/2009 |
| JP | 2009-200062 | 9/2009 |
| WO | 99/48339 | 9/1999 |
| WO | 03/083960 | 10/2003 |
| WO | 2009/084209 | 7/2009 |
| WO | 2009/147838 | 12/2009 |

* cited by examiner

PRIOR ART

ORGANIC EL DEVICE HAVING BANK WITH GROOVE, ORGANIC EL DISPLAY PANEL, AND METHOD FOR MANUFACTURING THE ORGANIC EL DEVICE

TECHNICAL FIELD

The present invention relates to an organic EL device, an organic EL display panel and the manufacturing methods thereof.

BACKGROUND ART

An organic EL device is a light-emitting element utilizing electroluminescence of an organic compound. The organic EL device has an anode electrode and a cathode electrode and an electroluminescent organic emitting layer arranged between the electrodes. The organic compound contained in the electroluminescent organic emitting layer is broadly divided into a combination of low molecular weight organic compounds (a host material and a dopant material) and a high molecular organic compound. Examples of the electroluminescent high molecular organic compound include polyphenylene vinylene called PPV and derivatives thereof. It is said that the organic EL device utilizing a high molecular organic compound can be driven at a relatively low voltage, consumes less power and can easily comply with the increased size of the display panel, and therefore, R&D on the device is being conducted positively.

In the organic EL display panel using the organic EL device, an electroluminescent organic emitting layer is formed using printing technologies such as ink-jet method in each pixel depending on the color (R, G or B) of the light emitted.

A high molecular organic emitting layer is arranged in each pixel by applying a polymer ink containing, for example, an organic emitting material and a solvent by ink-jet method, and the like. In the case when an ink containing an organic emitting material is applied to each pixel, it is necessary to prevent the ink from overflowing to neighboring pixels.

For preventing the ink from overflowing to neighboring pixels, a method in which each pixel is defined by a dividing wall (a bank), and the ink is applied in a region defined by the bank is known (See for example, Patent Document 1).

In the case when the region defined by the bank is printed by the ink containing the organic emitting material, it is preferable that the wettability of the bank is low for preventing the ink from overflowing to the non-target area.

A fluorine component is generally known to decrease the surface energy of a material and decrease the wettability. For the reason, in order to form a bank having a top face of low wettability, a technology for subjecting the bank surface to plasma treatment using a fluorocarbon based gas is known (See, for example, Patent Document 2).

It is also proposed to form a bank using a fluorine containing resin (See, for example, Patent Document 3). A bank consisting of a fluorine containing resin formed by a photolithography process (coating; development; washing; baking) has a feature of low wettability without performing the plasma treatment.

In addition, in order to divide the functional layer of the organic EL device by pixel, a technology to form a groove or a protrusion on the top face of the bank is known. The functional layer divided by the groove or the protrusion formed on the top face of the bank is broadly divided into a layer formed by coating (for example, an organic emitting layer, Patent Documents 4, 5 and 6) and a cathode (Patent Documents 7, 8, 9, 10 and 11).

In the Patent Document 4, there is disclosed a technology to prevent the ink from overflowing to the neighboring pixels by concaving the top face of the bank even when the ink containing the material of the functional layer overflows from the region defined by the bank. According to the Patent Document 4, the concave of the top face of the bank is formed by heating and changing the shape of the bank.

In the Patent Document 5, there is described a technology to define the region where the ink containing the material of the functional layer is applied, by forming a bank consisting of an organic material on a bank consisting of an inorganic material. According to the Patent Document 5, the bank is subjected to the surface treatment in order to obtain the desired wettability.

In the Patent Document 6, there is disclosed a technology to prevent the ink from overflowing to the neighboring pixels by forming a groove on the top face of the bank consisting of a novolak resin even when the ink containing the material of the functional layer overflows from the region defined by the bank.

In addition, in the Patent Documents 7, 8, 9, 10 and 11, there are disclosed technologies for forming a groove or a protrusion on the top face of the bank to separate the cathode electrically.

Patent Document 1: U.S. Pat. No. 6,388,377

Patent Document 2: Japanese Patent Application Laid-Open No. 2005-52835

Patent Document 3: Japanese Patent Application Laid-Open (Translation of PCT Application) No. 2005-522000

Patent Document 4: Japanese Patent Application Laid-Open No. 2006-032198

Patent Document 5: U.S. Patent Application No. 2007/0252518

Patent Document 6: U.S. Patent Application No. 2005/0093441

Patent Document 7: Japanese Patent Application Laid-Open No. 2006-294454

Patent Document 8: Japanese Patent Application Laid-Open No. 2000-215989

Patent Document 9: Japanese Patent Application Laid-Open No. 2003-045668

Patent Document 10 U.S. Patent Application No. 2005/0285512

Patent Document 11: U.S. Patent Application No. 2005/0237780

DISCLOSURE OF INVENTION

Problems to be Solved by the Invention

As previously described, the bank subjected to plasma treatment using a fluorocarbon based gas or the bank consisting of a fluorine containing resin has low wettability, hence it is suitable as a bank to define the region where the ink containing the organic emitting material is applied. However, it was difficult to define the border of the organic emitting layer, in the case when the organic emitting layer is formed by applying the ink containing the organic emitting material in the region defined by the bank.

FIG. 1 shows the shape of the organic emitting layer formed by applying the ink containing the organic emitting material in the region defined by the bank.

FIG. 1A is a plane view of the organic EL device having organic emitting layer 109 arranged in bank 105 or in the region defined by bank 105. In addition, the symbol 103 shows the anode in the region defined by the bank. In the case when the organic emitting layer is formed by applying the ink containing the organic emitting material in the region defined by the bank, there may be a case where the border of emitting layer 109 formed by bank 105 is distorted.

FIG. 1B is a cross-sectional view of the organic device in FIG. A at a chain line AA. In addition, FIG. 1C is a cross-sectional view of the organic device in FIG. A at a chain line BB.

In the cross-sectional view of FIG. 1B, emitting layer 109 leans to the side of bank 105 on the right side. On the other hand, in the cross-sectional view of FIG. 1C, emitting layer 109 leans to the side of bank 105 on the left side. The symbol 101 in FIG. 1B and FIG. 1C shows the substrate and the symbol 103 shows the anode.

As seen above, in the case the organic emitting layer is formed by applying the ink containing the organic emitting material in the region defined by the bank, the thickness of the organic emitting layer is liable to become nonuniform, since the border of the organic emitting layer becomes unstable. When the thickness of the organic emitting layer becomes nonuniform, irregular emitting may occur in the organic EL display panel or the product life of the organic EL display panel is shortened.

In particular, when the bank is consisted of a fluorine containing resin, it is difficult to control the border of the organic emitting layer. Table 1 shows the relationship between the thickness (height) of the bank comprising a fluorine containing resin and the fluorine concentration of the top face of the bank or the contact angle of the liquid (water and anisole). It shows that the wettability is decreased as the contact angle of water and anisole is increased

TABLE 1

| Width of Bank (µm) | Contact Angle (°) Water | Contact Angle (°) Anisole | Fluorine Conc. (atom %) |
|---|---|---|---|
| 1 | 81.2 | 45.5 | 7.5 |
| 0.9 | 78.9 | 43.0 | 6.9 |
| 0.8 | 76.5 | 40.6 | 6.3 |
| 0.7 | 74.1 | 38.2 | 5.6 |
| 0.6 | 71.7 | 35.7 | 5.0 |
| 0.5 | 69.4 | 33.3 | 4.3 |
| 0.4 | 67.0 | 30.8 | 3.7 |
| 0.3 | 64.6 | 28.4 | 3.0 |
| 0.2 | 62.2 | 25.9 | 2.4 |
| 0.1 | 59.9 | 23.5 | 1.7 |

As shown in Table 1, as the height of the bank comprising a fluorine containing resin increases, the fluorine concentration of the bank gradually increases and the wettability is decreased. As seen above, the wettability of the bank is different depending on its height. Therefore, the wettability of the wall face of the bank (the face defining the organic emitting layer) is not definite, and then it becomes more difficult to define the border of the organic emitting layer formed by the coating method in the region defined by the wall face of the bank.

The object of the invention is to provide an organic EL device comprising an organic emitting layer having uniform thickness by defining the border of the organic emitting layer even in the case when the organic emitting layer is formed in a region defined by the bank.

Means for Solving the Problem

The inventors discovered that by providing a groove on the top face of the bank, the position of the border can be defined even in the case when an organic emitting layer is formed by the coating method in the region defined by the bank, and completed the invention by conducting further examination.

Namely, a first aspect of the invention relates to an organic EL device shown below.

[1] An organic EL device comprising a substrate, an anode arranged on the substrate, an organic emitting layer arranged on the anode and a bank defining the arrangement region of the organic emitting layer, wherein a groove is formed on the top face of the bank and the groove defines the border of the organic emitting layer.

[2] The organic EL device described in [1], wherein the bank comprises a fluorine containing resin.

[3] The organic EL device described in [1] or [2], wherein the width of the groove formed on the top face of the bank is from 10 to 100 µm and the depth is from 0.1 to 2.0 µm.

[4] The organic EL device described in any one of [1] to [3], wherein the distance from the bottom face of the bank to the top face of the bank is from 0.1 to 2.0 µm.

[5] The organic EL device described in any one of [1] to [4], wherein the thickness of the organic emitting layer is from 50 to 100 nm.

[6] The organic EL device described in any one of [1] to [5], further comprising an intermediate layer between the anode and the organic emitting layer, the border of the intermediate layer being defined by the groove.

[7] The organic EL device described in [6], wherein the groove defining the border of the organic emitting layer and the groove defining the border of the intermediate layer are the same.

[8] The organic EL device described in [6], wherein two or more grooves are formed on the top face of the bank, and the groove defining the border of the organic emitting layer and the groove defining the border of the intermediate layer are different.

A second aspect of the invention relates to a manufacturing method of an organic EL device shown below.

[9] A manufacturing method of an organic EL device, comprising: a step to form an anode on the substrate; a step to form a bank consisting of a fluorine containing bank on the substrate so that at least a part of the anode is exposed; a step to form a groove on the top face of the bank; a step to form an organic emitting layer on the anode by applying an ink containing an organic emitting material in a region defined by the bank; and a step to form a cathode on the organic emitting layer.

[10] The manufacturing method of an organic EL device described in [9], wherein in a step of applying the ink containing the organic emitting material, the ink containing the organic emitting material is applied up to the inner edge or in the outer edge.

A third aspect of the invention relates to the organic EL display panel as shown below.

[10] An organic EL display panel comprising two or more organic EL devices described in any one of [1]~[8] arranged on the same flat face, wherein the bank defines a line shaped region, and in the line shaped region two or more organic EL devices are arranged in a line.

[11] An organic EL display panel comprising two or more organic EL devices described in any one of [1]~[8] arranged on the same flat face, wherein the bank defines the organic emitting layer of the organic EL devices respectively.

Advantageous Effects of Invention

According to the invention, an organic EL device having an organic emitting layer with uniform film thickness can be provided, because the border of the organic emitting layer is defined even in the case when the organic emitting layer is formed by the coating method.

In addition, according to the invention, the formation of a region where the organic emitting material is not applied is prevented, the organic EL device is prevented from the occurrence of the short circuit.

BEST MODE FOR CARRYING OUT THE INVENTION

Figure 1A:
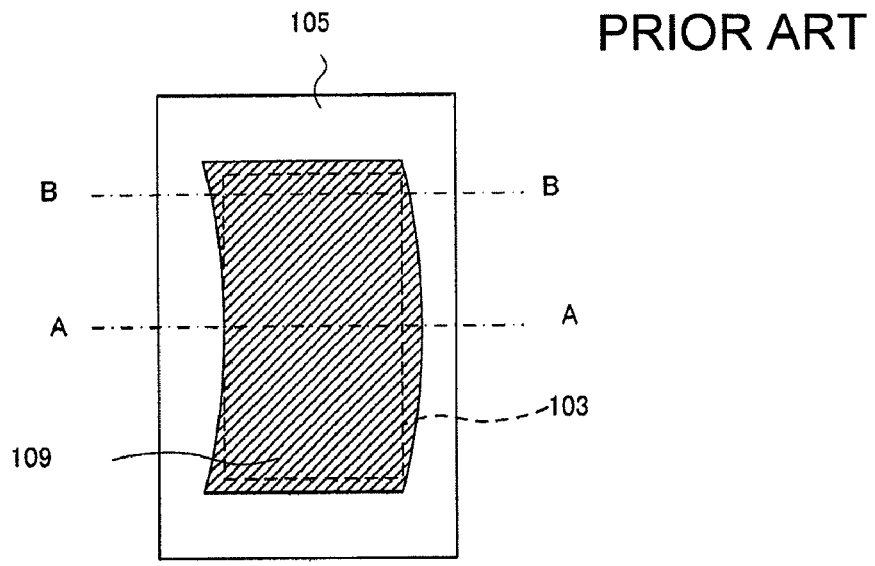
FIG. 1 is a plane view and a cross-sectional view of an conventional organic EL device.
Figure 1B:
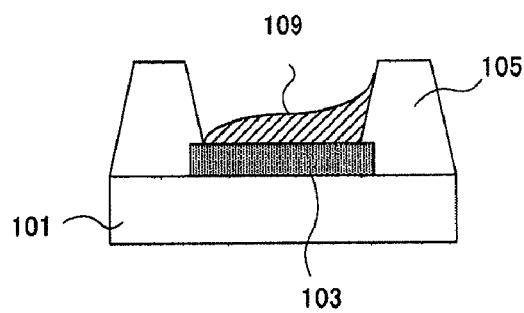
Figure 1C:
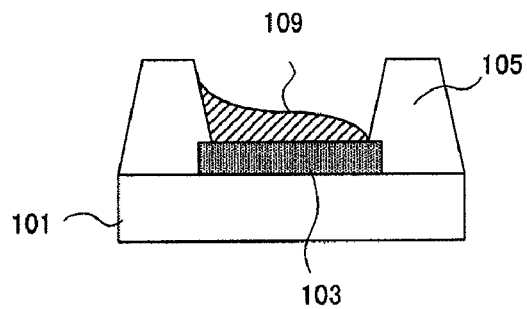

1. On the Organic EL Device of the Invention

The organic EL device of the invention comprises a substrate, an anode arranged on the substrate, an organic emitting layer arranged on the anode and a bank defining the organic emitting layer.

The organic EL device of the invention has a feature in the structure of the bank, and, the other constitution of the organic EL device of the invention can be the same as the known organic EL device, so long as the effect of the invention is not impaired.

For example, the organic EL device of the invention may be either a bottom emission type (a type to extract a light through the anode and the substrate) or a top-emission type (a type to extract a light through the cathode and the sealing layer).

The material of the substrate is different depending on whether the organic EL device is a bottom-emission type or a top emission type. In the case when the organic EL device is a bottom-emission type, since transparency is required for the substrate, examples of the material of the substrate include transparent resins such as PET (polyethylene terephtalate), PEN (polyethylene naphtalate), PI (polyimide) and the like, and the glass.

On the other hand, in the case when the organic EL device is a top-emission type, since transparency is not required for the substrate, the material of the substrate may be any of insulating materials.

The anode is a conductive member arranged on the substrate. The material of the anode is different depending whether the organic EL device of the invention is a bottom-emission type or a top emission type. In the case when the organic EL device is a bottom-emission type, since transparency is required for the anode, examples of the material of the anode include ITO (Indium Tin Oxide), IZO (Indium Zinc Oxide), tin oxide and the like.

On the other hand, in the case when the organic EL device is a top-emission type, since light reflectivity is required for the anode, examples of the material of the anode include an APC alloy (an alloy of silver, palladium and copper), ARA (an alloy of silver, rubidium and gold), MoCr (an alloy of molybdenum and chromium), NiCr (an alloy of nickel and chromium) and the like. The thickness of the anode is usually from 100 to 500 nm, and can be approximately 150 nm.

In addition, the anode may be connected to the drain electrode of the driving TFT. In the case when the organic EL device of the invention is a bottom-emission type, the driving TFT and the organic EL device are usually arranged on the same plane. On the other hand, in the case when the organic EL device of the invention is a top-emission type, the organic EL device is usually arranged over the driving TFT.

The organic emitting layer is a layer containing the organic emitting material. The organic emitting layer is arranged on the anode in the region defined by the bank (to be described later). The thickness of the organic emitting layer is preferably approximately from 50 to 100 nm (for example, 70 nm). Here, the thickness of the organic emitting layer means the distance from the bottom face of the organic emitting layer on the anode to the top face of the organic emitting layer on the anode.

The organic emitting material contained in the organic emitting layer may be either a low molecular organic emitting material or a high molecular organic emitting material, however, a high molecular organic emitting material is preferable, since the organic emitting layer containing a high molecular organic emitting material is easily coated. Examples of a high molecular organic emitting material include polyphenylene vinylene and its derivatives, polyacetylene and its derivatives, polyphenylene and its derivatives, poly (para-phenylene) ethylene and its derivatives, poly 3-hexyl thiophene (P3HT) and its derivatives, poly fluorene (PF) and its derivatives, and the like.

Between the anode and the organic emitting layer, a hole injection layer and/or an intermediate layer may be arranged. In the case when a hole injection layer and an intermediate layer are arranged between the anode and the organic emitting layer, the hole injection layer is arranged on the anode, an intermediate layer is arranged on the hole injection layer and the organic emitting layer is arranged on the intermediate layer. In addition, so far as the hole can be transferred from the anode to the organic emitting layer efficiently, the hole injection layer and the intermediate layer may be omitted.

The hole injection layer is a layer having a function to support the injection of the hole from the anode to the organic emitting layer to be described later. The hole injection layer is arranged on the anode. The examples of the material of the hole injection layer include PEDOT (Poly (3,4-ethylenedioxythiophene)) and oxides of transition metals. However, as the material of the hole injection layer, oxides of transition metals are preferable. Because the hole injection layer consisting of PEDOT is formed by the coating method, the thickness of the hole injection layer is hard to be uniform. In addition, since PEDOT is conductive, there is a high risk of the occurrence of the short circuit of the organic EL device. On the other hand, since the hole injection layer consisting of oxides of the transition metals is formed by sputtering, the film thickness is uniform. In addition, in the case when the hole injection layer is consisted of oxides of the transition metals, the risk of the occurrence of the short circuit of the organic EL device is prevented, because usually the bank is arranged on the hole injection layer.

Examples of the transition metals include tungsten, molybdenum, titanium, vanadium, ruthenium, manganese, chromium, nickel, iridium, APC (an alloy of silver-palladium-copper) and the combination thereof. Preferable materials for the hole injection layer are tungsten oxide (WOx) or molybdenum oxide (MoOx)

The thickness of the hole injection layer is typically from 10 nm to 100 nm and it can be approximately 50 nm.

The intermediate layer has a role to block the intrusion of electrons in the hole injection layer and to transport the hole efficiently to the organic emitting layer, and is a layer consisting of, for example, a polyanilin based material. The thickness of the intermediate layer is typically 5 nm or more and 100 nm or less, and preferably 10 nm or more and 50 nm or less (for example, approximately 20 nm).

The bank is a barrier defining the arrangement region of the organic emitting layer. Since the bank defines the region where the ink containing the organic emitting material (to be explained later) is applied, it is preferable to have the low wettability. In order to decrease the wettability of the bank, the bank may be subjected to the plasma treatment using a fluorine gas or fluorine containing resin may be used as the material of the bank. However, in the case when the bank is subjected to the plasma treatment using a fluorine gas, fluorine is simply adsorbed on the surface of the bank by an intermolecular force without forming chemical bonding to the surface of the bank. Therefore, even when fluorine is absorbed on the surface of the bank by subjecting the bank to the plasma treatment, there may be a case where migration of fluorine occurs by the thermal process and the like. If fluorine having a large electron-withdrawing ability migrates, for example, to the organic emitting layer (to be described later), there is a concern that it adversely affect the emitting efficiency by inactivating the photoluminescent exciton.

Thus, it is preferable that the bank material in the organic EL device of the invention comprises a fluorine containing resin. The fluorine containing resins may be those that contain a fluorine atom in at least a part of the repeating units among the high molecular repeating units.

Examples of these fluorine containing resins include a fluorinated polyimide resin, a fluorinated poly-methacryl resin, a fluorine containing novolak resin and the like.

On the other hand, in the case when the bank is subjected to the plasma treatment using a fluorine gas, examples of the bank material include a polyimide resin, a poly-methacryl resin, phenol-novolak resin and the like.

The height of the bank (the distance from the bottom face of the bank to the top face of the bank) is from 0.1 µm to 2 µm and especially preferable from 0.8 µm to 1.2 µm. In addition, the shape of the bank is preferably a forward tapered shape.

The bank is typically arranged on the substrate, however, it may be arranged on the anode, on the hole injection layer or on the intermediate layer.

In addition, it is preferable that the top face of the bank has liquid repellency. The contact angle of water on the top face of the bank is, for example, 90° or more. Here, the top face of the bank means a face in the vicinity of the top of the bank.

In the invention, it is characterized that a groove is formed on the top face of the bank. The groove formed on the bank defines the border of the organic emitting layer described above. It is preferable that the width of the groove is from 10 to 100 µm, and the depth of the groove is from 0.1 to 2.0 µm. A bank may have one groove or more than one groove. In the case when the bank has more than one groove, the gap between the grooves is preferably from 5 to 30 µm. In addition, in the case when the bank has more than one groove, the width of two grooves may be different.

In addition, it is preferable that the depth of the groove becomes deep as the width becomes wider. Moreover, the depth of the groove may be the same as the height of the bank (the distance from the bottom of the bank to the top face of the bank).

Figure 2A:
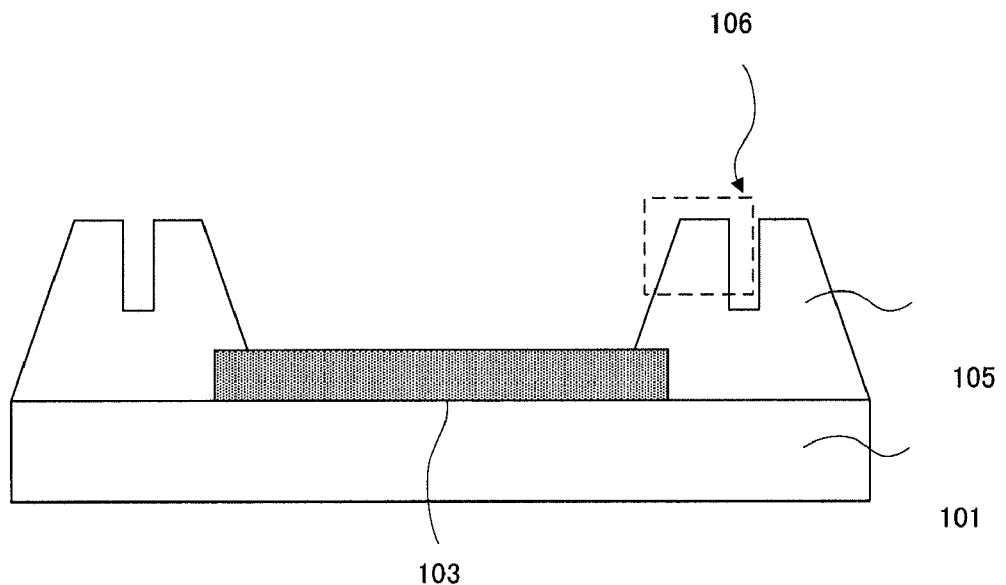
FIG. 2 is a cross-sectional view of the organic EL device of the present invention.

The relationship between the shape of the bank and the shape of the groove will be explained below in detail using figures. FIG. 2A is a cross-sectional view of the organic emitting layer in which the cathode and the organic emitting layer are omitted. As indicated in FIG. 2A, the organic device of the invention comprises substrate 101, cathode 103 and bank 105. Groove 106 is formed on the top face of the bank.

Figure 2B:
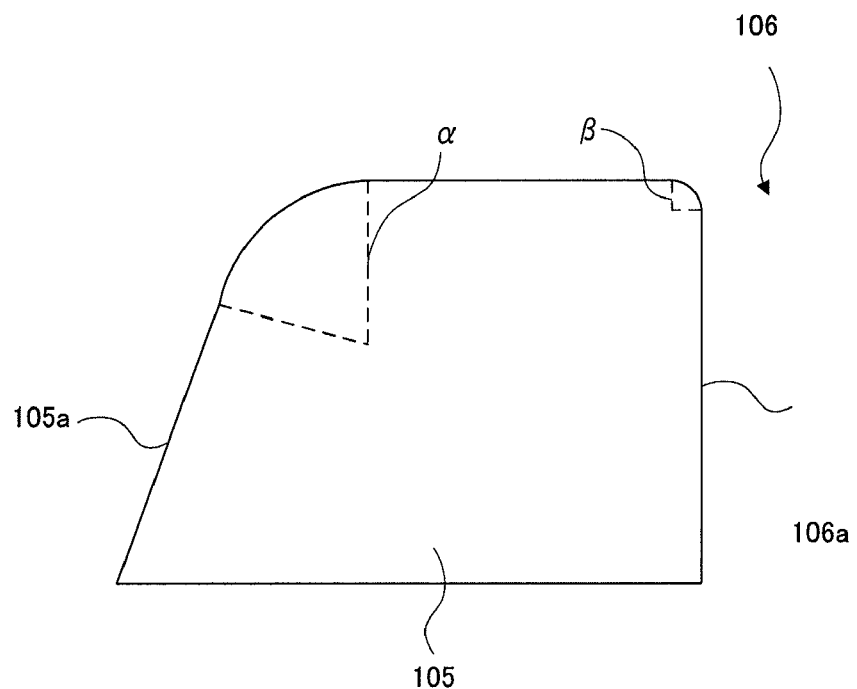

FIG. 2B is an enlarged view of the region surrounded by a square in FIG. 2A. As shown in FIG. 2B, it is preferable in the invention that the curvature radius a of bank wall 105a is larger than the curvature radius β of the groove side wall 106a. Specifically, the curvature radius α is preferably two times and more the curvature radius P. Moreover, it is preferable that the curvature radius α is from 0.2 to 0.5 µm, and the curvature radius β is from 0.01 to 0.2 µm.

As described above, in the invention, it is characterized that the groove formed on the bank defines the border of the organic emitting layer. Therefore, in the invention, it is characterized that a part of the organic emitting layer is arranged on the top face of the bank. Here, "the groove defines the border of the organic emitting layer" means that the border of the organic emitting layer is defined by the inner edge or the outer edge of the groove.

Here, "the inner edge of the groove" means the edge on the side of the organic emitting layer among edges of the groove, and "the outer edge of the groove" means the edge on the opposite side of the inner edge of the groove.

Figure 3A:
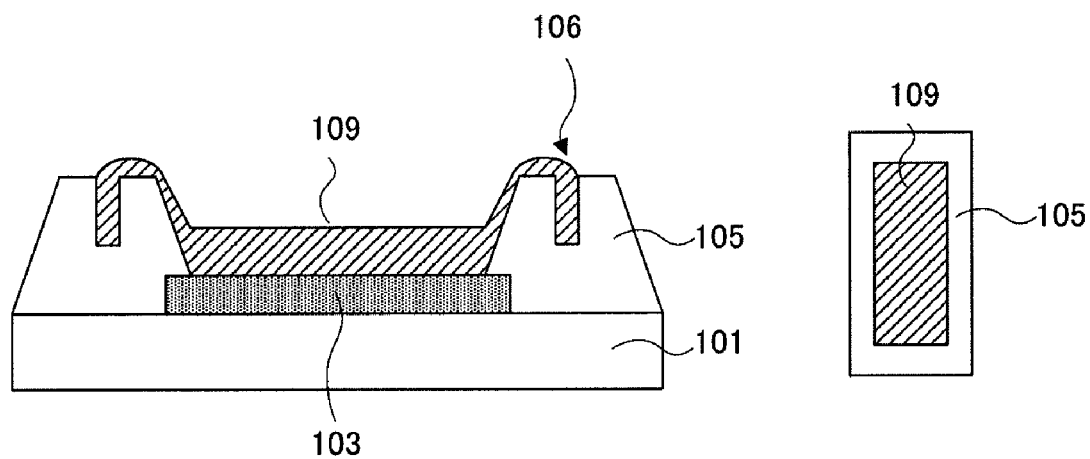
FIG. 3 is a cross-sectional view of the organic EL device of the present invention.

FIG. 3A is a cross-sectional view of the organic EL device of the invention in which the border of the organic emitting layer is defined by the outer edge of the groove. As shown in FIG. 3A, the organic EL device of the invention comprises substrate 101, anode 103, bank 105 and organic emitting layer 109. On the top face of bank 105, groove 106 is formed.

As shown in FIG. 3A, organic emitting layer 109 is defined by the outer edge of groove 106. Moreover, in the case when organic emitting layer 109 is defined by the outer edge of groove 106, organic emitting layer 109 is also arranged in groove 106.

Figure 3B:
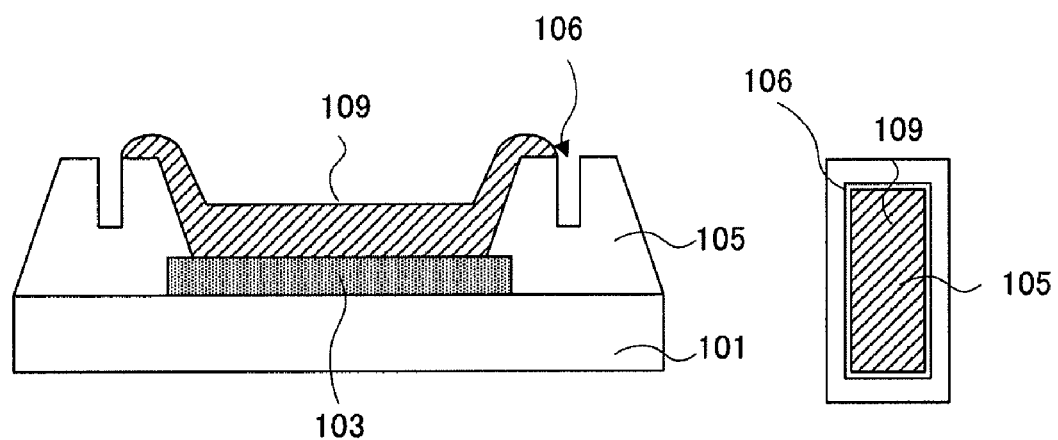

FIG. 3B is a cross-sectional view of the organic EL device of the invention wherein the border of the organic emitting layer is defined by the inner edge of the groove. As shown in FIG. 3B, the organic EL device of the invention comprises substrate 101, anode 103, bank 105 and organic emitting layer 109. On the top face of bank 105, a groove 106 is formed.

As shown in FIG. 3B, organic emitting layer 109 is defined by the inner edge of groove 106. Moreover, in the case when organic emitting layer 109 is defined by the inner edge of groove 106, organic emitting layer 109 is not arranged in groove 106.

By defining the border of the organic emitting layer by the groove formed on the top face of the bank, the thickness of the organic emitting layer becomes uniform. In addition, since a part of the organic emitting layer is arranged also on the top face of the bank, the organic emitting layer covers the anode entirely, and as a result the risk of the direct contact of the anode and the cathode and the risk of the occurrence of the short circuit of the organic EL device are resolved. The mechanism in which the groove formed on the bank defines the border of the organic emitting layer and makes the film thickness of the organic emitting layer uniforms will be described later in the manufacturing method of the organic EL device.

In addition, in place of the groove, a protrusion that defines the border of the organic emitting layer may be formed on the top face of the bank.

The cathode is arranged on the organic emitting layer. The material of the cathode is different depending on whether the organic EL device of the invention is a bottom emission type or a top emission type. In the case when the organic EL device of the invention is a top emission type, light permeability is required for the cathode, and examples of the material of the cathode include ITO, IZO, Ba, WOx and the like. In addition, in the case when the organic EL device is a top emission type, an organic buffer layer formed by the vapor deposition method may be arranged between the organic emitting layer and the cathode.

On the other hand, in the case when the organic EL device of the invention is a bottom emission type, examples of the material of the cathode include Ba, BaO, Al and the like, but are not particularly limited.

By providing a covering material (sealing material) on the cathode, the organic EL device may be sealed. By using the covering material, intrusion of water and oxygen into the organic layer can be suppressed.

As seen above, in the organic EL device of the invention, the organic emitting layer is formed by the coating method in the region defined by the bank, however, the film thickness is uniform, because the border of the organic emitting layer is defined at the desired position. Therefore, the product life of the organic EL device of the invention is long.

In addition, in the organic EL device of the invention, since a part of the organic emitting layer is also arranged on the top face of the bank, there is no risk of the direct contact between the anode and the cathode, and therefore there is no risk of occurrence of the short circuit of the organic EL device.

2. On the Organic EL Display Panel

The organic EL display panel may be constituted by arranging a plurality of the organic EL devices of the invention on one substrate in a matrix manner (FIG. 9 to FIG. 13). In the organic EL display panel, each organic EL device functions as a pixel.

The EL display panel of the invention has a constitution in which the above described organic EL device is basically arranged on the substrate in a matrix manner. The anode, the bank, the hole infusion layer, the intermediate layer, the organic emitting layer and the cathode have following features. Furthermore, the organic EL display of the invention may be either a passive-matrix type or an active-matrix type.

[Anode]

The configuration of the anode is different depending on whether the organic EL display panel is a passive matrix type or an active matrix type.

In the case when the organic EL display panel is a passive matrix type, a plurality of anodes of a line shape are arranged on the substrate. The anodes of a line shape are preferably in parallel each other. In the case when the organic EL display panel is an active matrix type, the anode is arranged on the substrate independently by pixel.

[Bank]

The bank may define each pixel (the organic EL device) (FIG. 12) or may define a group of pixels arranged in a line (FIG. 9).

In the case when the bank defines the group of pixels arranged in a line, a plurality of the banks are formed on the substrate and define regions of line shape on the substrate (FIG. 9). In the region of a line shape defined by the bank of a line shape, more than one pixel are arranged in a line. The bank of a line shape is preferably in parallel each other. In addition, in the case when the anode is of a line shape, it is preferable that the line direction of the bank of a line shape and the line direction of the anode are orthogonalized.

[Hole Injection Layer]

In the organic EL display panel of the invention, a plurality of pixels may share one hole injection layer or the hole injection layer may be arranged independently by pixel.

[Intermediate Layer]

The intermediate layer can be arranged in the region defined by the bank. Namely, in the case when the bank defines each pixel, the intermediate layer is arranged independently by pixel. On the other hand, in the case when the bank defines the group of pixels arranged in a line, the intermediate layer is formed in a line shape in the region of a line shape. In this case, the pixels in the region of a line shape share a line shape intermediate layer.

[Organic Emitting Layer]

The organic emitting layer is arranged in the region defined by the bank. Namely, in the case when the bank defines each pixel, the organic emitting layer is arranged independently by pixel. On the other hand, in the case when the bank defines the group of pixels arranged in a line, the organic emitting layer is formed in a line shape in the region of a line shape. In this case, the pixels in the region of a line shape share one organic emitting layer in the region of a line shape.

In addition, the border of the organic emitting layer of each of the organic EL devices contained in the organic EL display panel is defined by the groove formed on bank.

The organic emitting material is appropriately selected such that the desired color (red R, green G or blue B) is obtained from each pixel. For example, the green pixel is arranged next to the red pixel, the blue pixel is arranged next to the green pixel, and the red pixel is arranged next to the blue pixel (See FIG. 9).

[Cathode]

The configuration of the cathode is different depending on whether the organic EL display panel is an active matrix type or a passive matrix type. In the case when the organic EL display panel is an active matrix type, a plurality of pixels may share the cathode, because in the active matrix type organic EL display panel, each pixel is driven by an independent TFT. On the other hand, in the case when the organic EL display panel is a passive matrix type, a plurality of cathodes of a line shape are arranged on the panel. The cathode of a line shape is preferably in parallel each other. Moreover, the line direction of the cathode of a line shape is preferably orthogonalized with the line direction of the anode of a line shape.

As described above, the organic EL device of the invention has the organic emitting layer with uniform thickness, although the organic emitting layer is formed by the coating method in the region defined by the bank. Therefore, by arranging the organic EL device of the invention on the substrate in a matrix shape, the organic EL display device with uniform emission can be provided.

3. On the Manufacturing Method of the Organic EL Device of the Invention

The organic EL device of the invention can be manufactured by any method as long as the effect of the invention is not impaired.

The preferable manufacturing method of the organic EL device of the invention will be explained referring to figures. FIG. 4A~FIG. 4G show the manufacturing method of the organic EL device of the invention. The figures on the left side of each figure are cross-sectional views of the organic EL device, and the figures on the right side are plane views of the organic EL device.

Figure 4A:
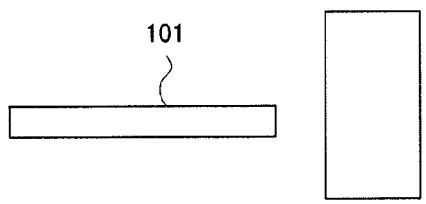
FIG. 4 is a figure showing a manufacturing flow chart of the organic device of the invention.
Figure 4B:
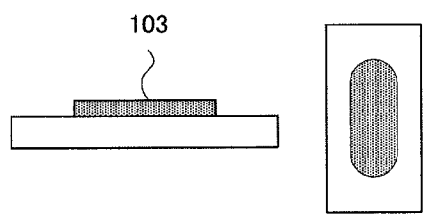
Figure 4C:
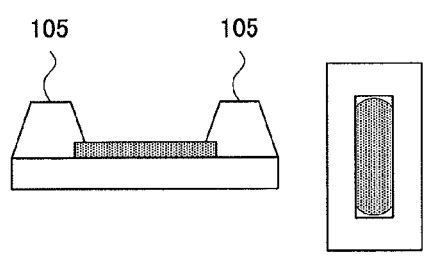
Figure 4D:
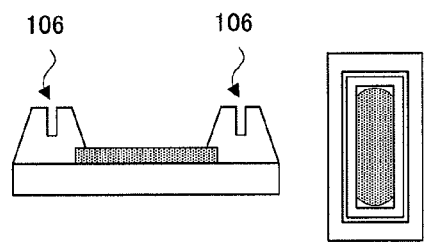
Figure 4E:
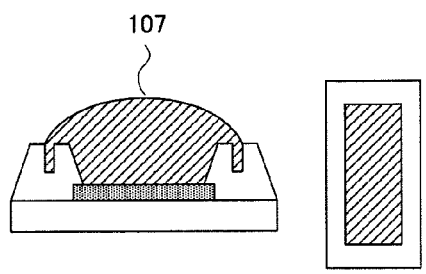
Figure 4F:
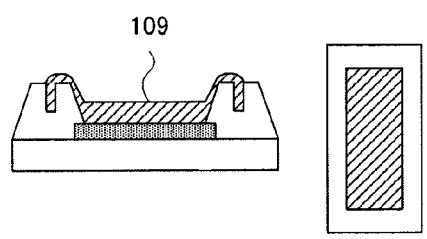
Figure 4G:
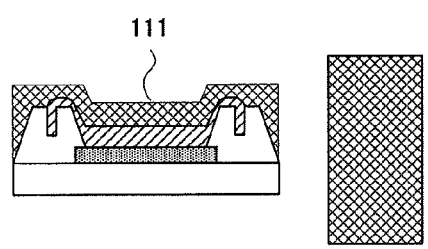

As shown in FIG. 4, the manufacturing method of the organic EL device of the invention comprises: 1) a first step to provide the substrate (FIG. 4A); 2) a second step to form the anode on the substrate (FIG. 4B); 3) a third step to form the bank (FIG. 4C); 4) a forth step to prepare the groove on the top face of the bank (FIG. 4D); 5) a fifth step to form the organic emitting layer in the region defined by the bank (FIG. 4E,F); and 6) a sixth step to form the cathode on the organic emitting layer (FIG. 4G).

In the first step, substrate 101 is prepared. Substrate 101 may incorporate the driving TFT.

In the second step, anode 103 is formed on substrate 101. The anode may be formed, for example, by forming the layer consisting of the material of anode 103 on substrate 101 by sputtering and the like and patterning the formed layer through etching.

In addition, anode 103 may be formed by applying the solution of material of anode 103 on substrate 101 using ink-jet, dispenser, anastatic printing, intaglio printing and the like, and by drying the applied material.

In the third step, bank 105 is formed. As described above, the bank comprises a fluorine containing resin. Bank 105 can be formed by using the photolithography technology or the printing technology.

In the case when bank 105 is formed by using the photolithography technology, a) a step to form a film of a photosensitive resin containing a fluorine containing resin on substrate 101 and anode 103 and b) a step to expose at least a part of anode 103 by exposing and developing the film are involved.

The film of a photo-sensitive resin composition comprising a fluorine containing resin can be formed on substrate 101 and on anode 103 by applying, for example, a fluorine containing resin composition using spin coating, die-coating, slit-coating and the like to form a film consisting of a fluorine containing resin composition; and by drying the formed film. The drying condition is not limited particularly, and the film may be left standing for 2 to 3 minutes at 80° C.

By exposing and developing the film of the photo-sensitive resin composition comprising a fluorine containing resin, the anode on which the ink containing the organic emitting material (to be described later) is applied is exposed.

After developing, the film is subjected to baking treatment. The condition of baking treatment is not particularly limited, and for example the temperature is approximately 200° C. or more, and the time is approximately 1 hour.

On the other hand, in the case when a resin film of determined pattern is formed by using the printing technology, the intaglio printing method and the anastatic printing method may be used for printing. In the case when bank 105 is formed using the intaglio printing method, the other constitutional members are hardly damaged.

In the manufacturing method of the organic EL device of the invention, a hole injection layer may be formed between steps 2 and 3. The hole injection layer can be formed on the anode by sputtering and the like.

In the fourth step, groove 106 is formed on the top face of bank 105. Groove 106 on the top face of bank 105 may be formed by dry-etching. Furthermore, groove 106 may be formed, for example, by the photolithography method. Groove 106 on the top face of bank 105 can be formed by irradiating a selective portion of a negative type resist film with ultraviolet light, which portion is other than those where the groove of the bank is formed; and by performing a wet-etching on the region where is not irradiated. In addition, for forming groove 106 on the top face of bank 105 by using the photolithography method, by irradiating a selective portion of a positive type resist film with ultraviolet light, in which the groove of the bank is formed; and by subjecting the irradiated region to wet-etching. Moreover, for controlling the depth of the groove, a half-tone mask may be used.

In addition in the fourth step, a protrusion may be formed in place of the groove on the top face of the bank. The protrusion may be formed, for example, by the photolithography method using a half-tone mask.

In the fifth step, the organic emitting layer is formed. Organic emitting layer 109 is formed, for example, in the region defined by bank 105, by applying the ink containing the organic emitting material and the solvent, and by drying the applied ink. Examples of the solvent include aromatic solvents such as anisole. The coating method is not particularly limited. The coating method includes ink-jet, dispenser, nozzle-coating, spin-coating, intaglio printing, anastatic printing and the like. Preferable coating method is ink-jet printing.

In addition, the amount of the ink to be supplied is preferably 40~120 pl per a pixel (5000~30000 μm$^2$).

By applying the ink containing the organic emitting material and the solvent to the pixel region using the coating method such as ink-jet, the organic emitting layer can be formed easily without causing any damage to the other materials.

In the invention, it is characterized that the border of organic emitting layer 109 is defined by groove 106 formed on the top face of bank 105.

As shown in FIG. 4E, ink 107 applied on anode 103 is applied up to the edge of the groove formed on the top face of bank 105. In addition, ink 107 is applied to the inside of groove 106. On the other hand, ink 107 applied up to the edge of groove 106 is prevented from overflowing from the groove by the edge effect of groove 106 and by the surface tension of ink 107.

In addition, in FIG. 4E, an example in which ink 107 is applied up to the region defined by the edge of groove 106 was shown, however ink 107 may be applied up to the inner edge of the groove. In the case when ink 107 is applied to the inner edge of groove 106, ink 107 is not applied to the inside of groove 106. Whether the ink is applied to the outer edge or to the inner edge can be selected by controlling the amount of the ink to be applied.

By drying the ink applied in this manner, organic emitting layer 109 whose border is defined by groove 106 is formed.

In the conventional organic EL device, overflowing of the ink containing the organic emitting material from the bank was prevented by giving liquid repellency to the bank through the plasma treatment and the like using a fluorine gas, and the interface between the treated region and the non-treated region was set as the position of the border of the organic emitting material (the border of the region where the ink is applied). However, there were cases where the emitting efficiency of the organic device is deteriorated by the plasma treatment using a fluorine gas.

Then, the formation of the bank using a fluorine containing resin having high liquid repellency was examined. In the case when the organic emitting layer is defined by the bank comprising a fluorine containing resin, the overflow of the ink containing the organic emitting material from the bank is prevented due to liquid repellency of the resin itself without performing plasma treatment. However, in the case when the bank was formed using a fluorine containing resin as described above, it was difficult to control the position of the border of the organic emitting layer and to get the organic emitting layer having uniform film thickness.

On the other hand, in the present invention, a groove was formed on the top face of the bank consisting of a fluorine containing resin, and the inner edge or the outer edge of the groove were set as the position of the border of the organic emitting layer.

By defining the border of the organic emitting layer by the groove formed on the top face of the bank in this manner, the position of the border of the organic emitting layer can be defined at a desired position in spite of the fact that the bank is formed using a fluorine containing resin, and thus the organic emitting layer having uniform thickness can be obtained.

In addition, before forming the organic emitting layer, a solution of the material of the intermediate layer containing a polyaniline based material may be applied in the region defined by the bank using the ink-jet method, the die-coating method and the anastatic printing method. It is preferable that, similar to organic emitting layer 109, the border of the intermediate layer is also defined by the groove formed on the top face of the bank.

In the sixth step, cathode 111 is formed on the organic emitting layer. Cathode 111 is formed, for example, by the vapor-deposition method or sputtering.

As seen above, in this invention, since the border of the organic emitting layer is defined by the groove formed on the top face of the bank, even in the case when the bank is formed using a fluorine containing resin, the organic emitting layer having an uniform thickness can be obtained.

Moreover, since the ink containing the organic emitting material is also applied to the top face of the bank, the ink containing the organic emitting material can be applied on the entire face of the exposed anode. For this reason, the risk of the direct contact of between the cathode and the anode and the risk of the occurrence of the short circuit of the organic EL device are resolved.

The embodiments of the invention will be explained below referring to drawings, however, the invention is not limited by these embodiments.

Embodiment 1

Figure 5:
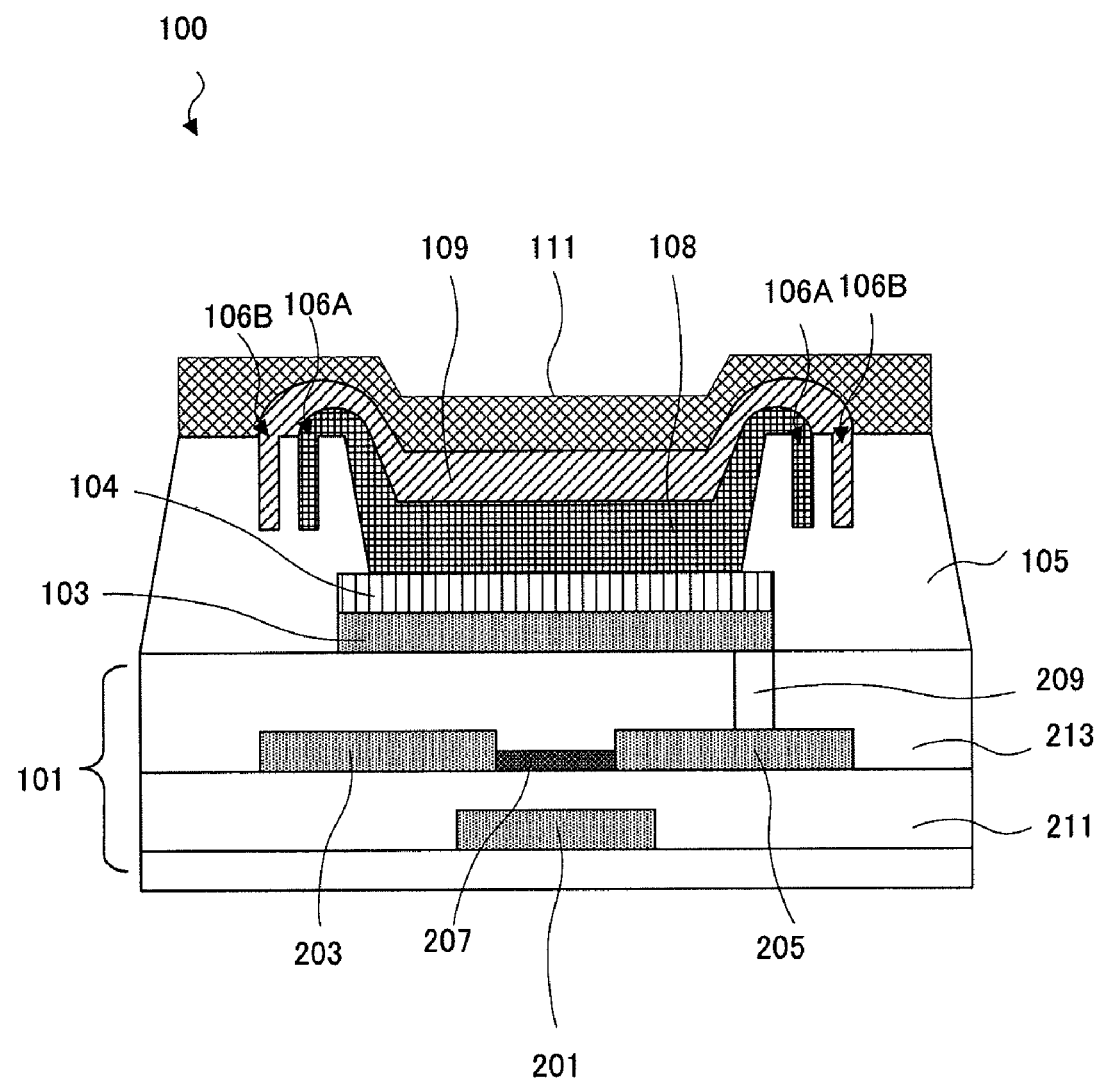
FIG. 5 is a cross-sectional view of the organic EL device of the Embodiment 1.

FIG. 5 is a cross-sectional view of organic EL device 100 of Embodiment 1.

As shown in FIG. 5, organic EL device 100 comprises substrate 101, anode 103, hole injection 104, bank 105, intermediate layer 108, organic emitting layer 109 and cathode 111.

Substrate 101 incorporates the driving TFT. Substrate 101 comprises gate electrode 201, source electrode 203, drain electrode 205. Gate electrode 201 and source electrode 203 or drain electrode 205 is insulated by insulating film 211. Furthermore, source electrode 203 and drain electrode 205 are connected by semiconductor layer 207. Furthermore, on semiconductor layer 207, on source electrode 203 and on drain electrode 205, flattening film 213 is arranged. Drain electrode 205 and anode 103 are connected through contact hole 209.

The hole injection layer is arranged on anode 103. Bank 105 defines the arrangement region of intermediate layer 108 and emitting layer 109. On the top face of bank 105, groove 106A and groove 106B are formed. Groove 106A defines the border of intermediate layer 108, and groove 106B defines the border of emitting layer 109. Furthermore, cathode 111 is arranged on emitting layer 109.

Referring to the figures, organic EL device 100 of the embodiment will be explained below. FIG. 6 is a flow chart illustrating the manufacturing method of organic EL device 100.

Figure 6A:
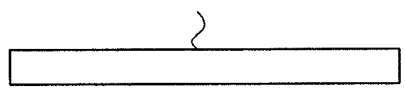
FIG. 6 is a figure showing a manufacturing flow chart of the organic EL device of the Embodiment 2.
Figure 6B:
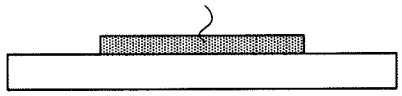
Figure 6C:
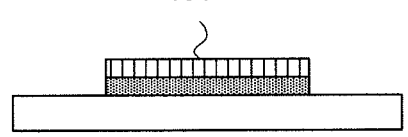
Figure 6D:
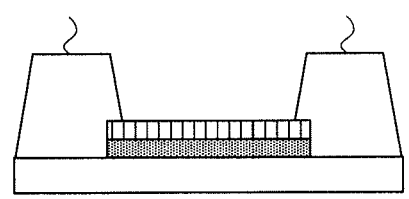
Figure 6E:
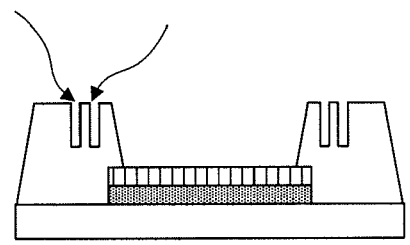
Figure 6F:
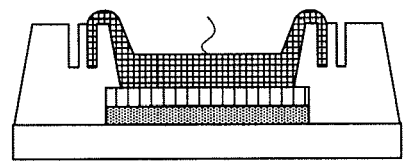
Figure 6G:
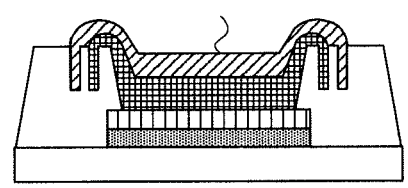
Figure 6H:
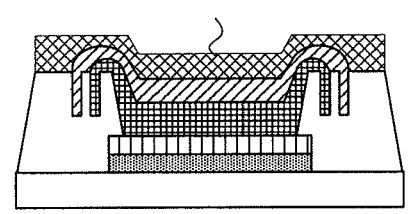

As shown in FIG. 6, the manufacturing method of organic EL device 100 comprises: 1) a first step to prepare substrate 101 (FIG. 6A); 2) a second step to form anode 103 on the substrate (FIG. 6B); 3) a third step to form hole injection layer 104 on anode 103 (FIG. 6C); 4) a fourth step to form bank 105 on substrate 101 (FIG. 6D); 5) a fifth step to form grooves 106A and 106B on the top face of bank 105 (FIG. 6E); 6) a sixth step to form intermediate layer 108 by applying a solution of the material of the intermediate layer in the region defined by bank 105 (FIG. 6F); 7) a seventh step to form organic emitting layer 109 by applying the ink containing the organic emitting material in the region defined by bank 105 (FIG. 6G); and 8) a eighth step to form the cathode on emitting layer 109 (FIG. 6H).

As just described, in the embodiment of the invention, since the position of the borders of the intermediate layer and the organic emitting layer are defined by the groove formed on the bank, even in the case when the organic emitting layer is formed by the coating method in the region defined by the bank, the positions of the borders of the intermediate layer and the organic emitting layer can be defined at desired positions. As result, the thickness of the intermediate layer and the thickness of the organic emitting layer become uniform.

Embodiment 2

In Embodiment 1, an example in which the groove defining the border of the intermediate layer and the groove defining the border of the organic emitting layer are different was explained. In Embodiment 2, an example in which the groove defining the border of the intermediate layer and the groove defining the border of the organic emitting layer are the same will be explained.

Figure 7:
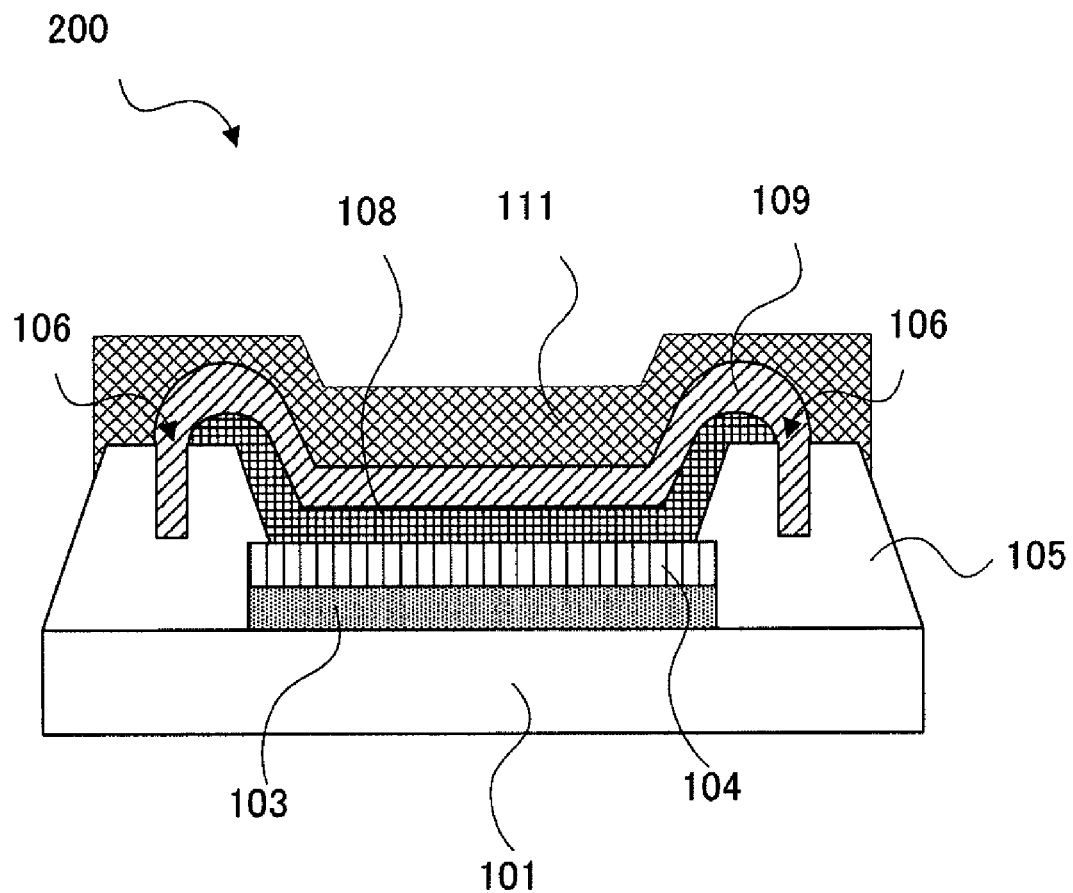
FIG. 7 is a cross-sectional view of the organic EL device of the Embodiment 2.

FIG. 7 is a cross-sectional view of organic EL device 200 of Embodiment 2. The same symbols are attached to the same constitutional members as those explained in organic EL device 100, and then the explanation will be omitted.

As shown in FIG. 7, bank 105 defines the region of intermediate layer 108 and organic emitting layer 109. On the top face of bank 105, groove 106 is formed. The groove 106 defines intermediate layer 108 and emitting layer 109. As shown in FIG. 7, intermediate layer 108 is defined by the inner edge of groove 106, and the organic emitting layer is defined by the outer edge of groove 106.

As seen above, in this embodiment, since the borders of the intermediate layer and the organic emitting layer can be defined by one groove, the film thicknesses of the intermediate layer and the organic emitting layer can be uniformed by a more simple structure.

Embodiment 3

In Embodiments 1 and 2, an organic EL device in which a groove was formed on the top face of the bank was explained. In Embodiment 3, an organic EL device in which a protrusion was formed on the top face of the bank will be explained.

Figure 8A:
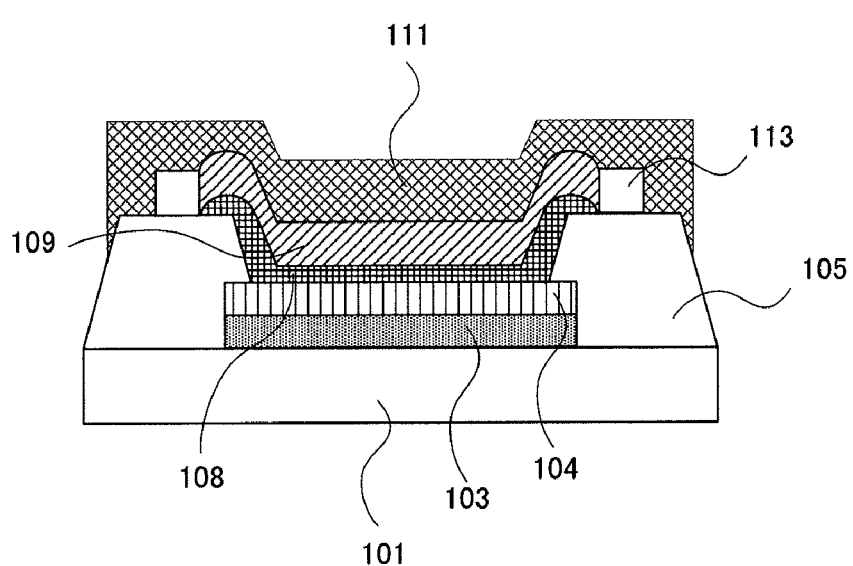
FIG. 8 is a cross-sectional view of the organic EL device of the Embodiment 3.

FIG. 8A is a cross-sectional view of organic EL device 300*a* of Embodiment 3. Organic EL device 300*a* is the same as organic EL device 100 of Embodiment 1 excepting that organic EL device 300*a* has a protrusion. The same symbols are attached to the same constitutional members as those explained in organic EL device 100 in Embodiment 1, and then the explanations of the members will be omitted.

As described above, organic EL device 300*a* has protrusion 113 formed on the top face of bank 105. It is preferable that the height of protrusion 113 is from 0.1 to 2 μm, and the width of protrusion 113 is from 5 to 25 μm. The material of protrusion 106 may be the same as those of bank 105 or may be different from those of bank 105. The material of protrusion 113 is, for example, an acrylic resin, polyimide resin and the like. The protrusion can be formed, for example, by the photolithography method.

Protrusion 113 defines the border of intermediate layer 108 and the border of emitting layer 109. Here, "protrusion 113 defines the border of intermediate layer 108 and the border of emitting layer 109" means that the borders of intermediate layer 108 and emitting layer 109 are defined by the boundary of protrusion 113 and bank 105 or by the edge of protrusion 113.

In organic EL device 300*a* shown in FIG. 8A, the border of intermediate layer 108 is defined by the boundary of protrusion 113 and bank 105, and the border of emitting layer 109 is defined by the inside edge of protrusion 113.

Figure 8B:
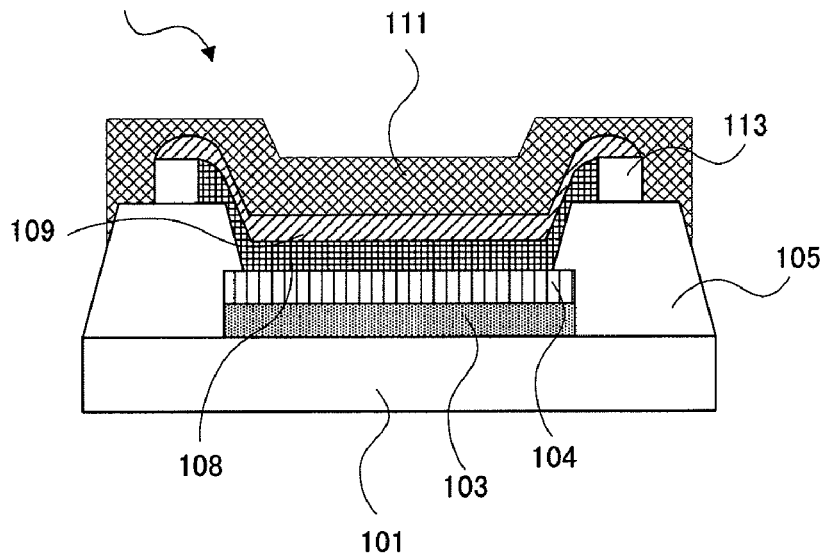

In addition, as in the case of the organic EL device shown in FIG. 8B, the border of intermediate layer 108 may be defined by the inside edge of protrusion 113, and the border of the organic emitting layer may be defined by the outside edge of protrusion 113.

As seen above, in the embodiment, the border of the organic emitting layer is defined by the protrusion formed on the top face of the bank in place of the groove.

In Embodiments 1 to 3, the organic EL device was explained. In the embodiments below, the organic EL display panel will be explained.

Embodiment 4

In Embodiment 4, an active matrix type organic EL device will be explained.

Figure 9A:
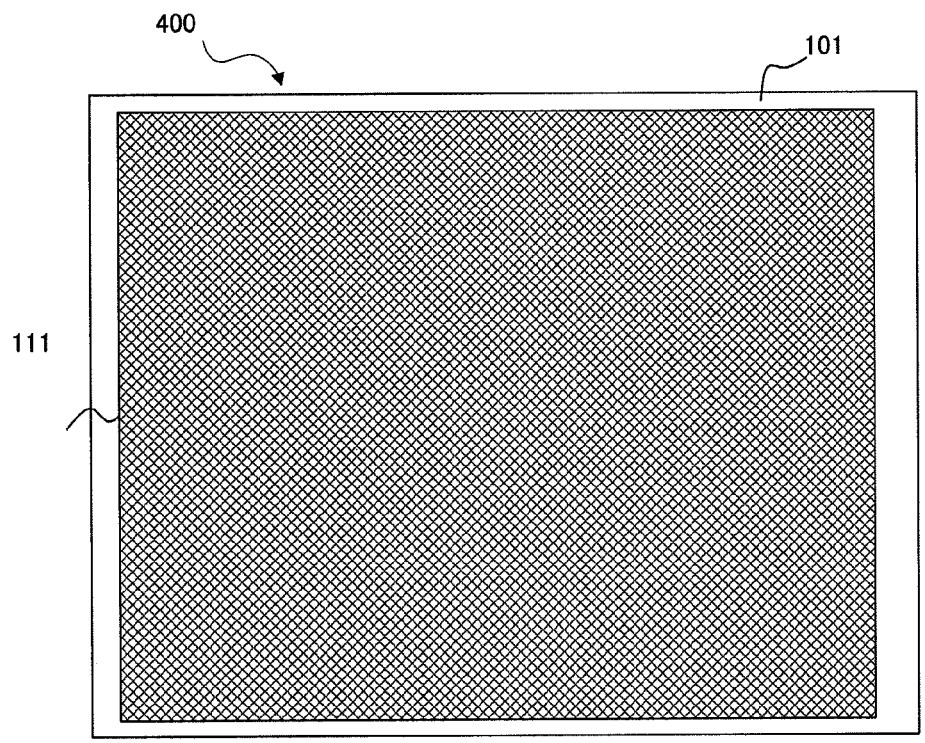
FIG. 9 is a plane view of the organic EL display panel of the Embodiment 4.
Figure 9B:
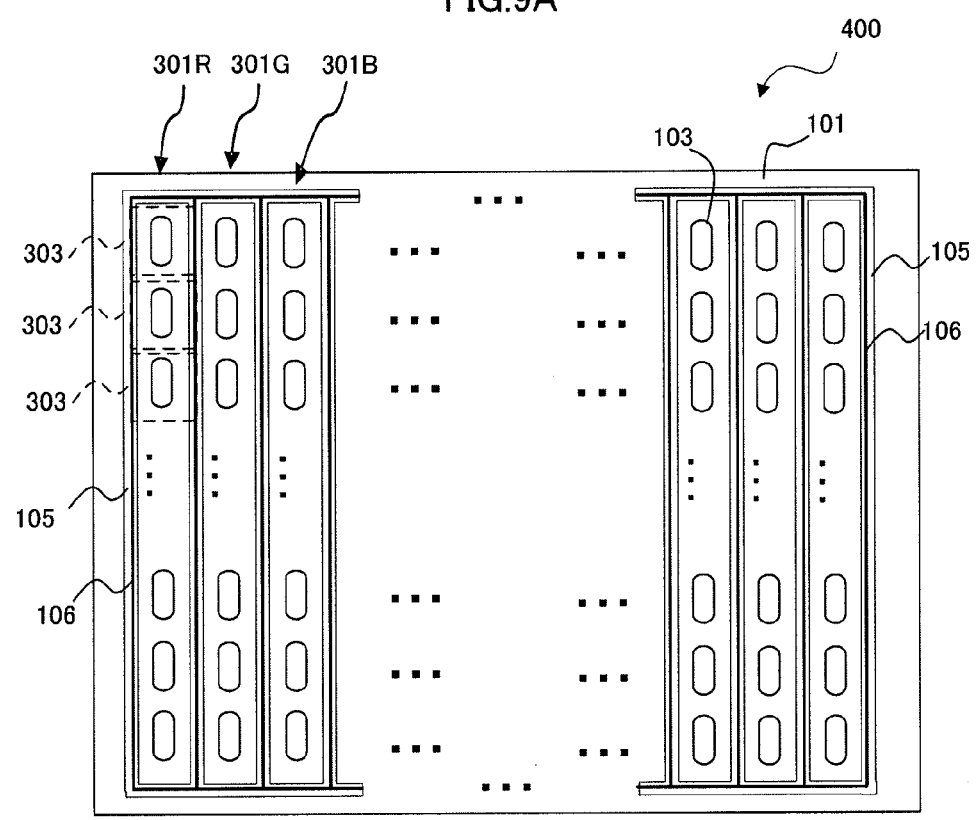

FIG. 9A is a plane view of organic EL display panel 400 of the embodiment. FIG. 9B is a plane view of organic EL display panel 400 in which the cathode, the organic emitting layer, the intermediate layer and the hole injection layer are omitted. As shown in FIG. 9, organic EL display panel 400 has a plurality of pixels 303 arranged in a matrix shape. In organic EL display panel 300, each organic EL device functions as a pixel. In addition, in organic EL display panel 400, a plurality of pixels 303 share one cathode.

As shown in FIG. 9B, organic EL device panel 400 has a plurality of banks 105 of a line shape. Moreover, on the top face of bank 105 of a line shape, a groove 106 that is parallel to the line direction of bank 105 is formed. Bank 105 of a line shape defines region 301 of a line shape (hereinafter referred to as "the color-producing region"). Color-producing region 301 is preferably surrounded by the bank completely. In color-producing region 301, anodes 103 are arranged in a line. In addition, color-producing region 301 is mutually parallel. In color-producing region 301, the organic emitting layer and the intermediate layer are formed in a line shape, respectively.

In organic EL display panel 300, color-producing region 301R represents a region which emits a red light, color-producing region 301G represents a region which emits a green light, and color-producing region 301B represents a region which emits a blue light. Since each region 301 is defined by the bank, the ink applied to each color-producing region is not mixed each other.

As seen above, according to this embodiment, since the intermediate layer and the organic emitting layer can be formed in a line shape, an organic EL display panel having organic emitting layers with identical shape among pixels can be provided.

Embodiment 5

In the embodiment, an example in which an inorganic film is formed between the anodes in the color-producing region is explained. The plane view of the organic EL device of this embodiment is the same as that of organic EL device 400 of Embodiment 4. Therefore, FIG. 9A is also the plane view of the organic EL device of this embodiment.

Figure 10:
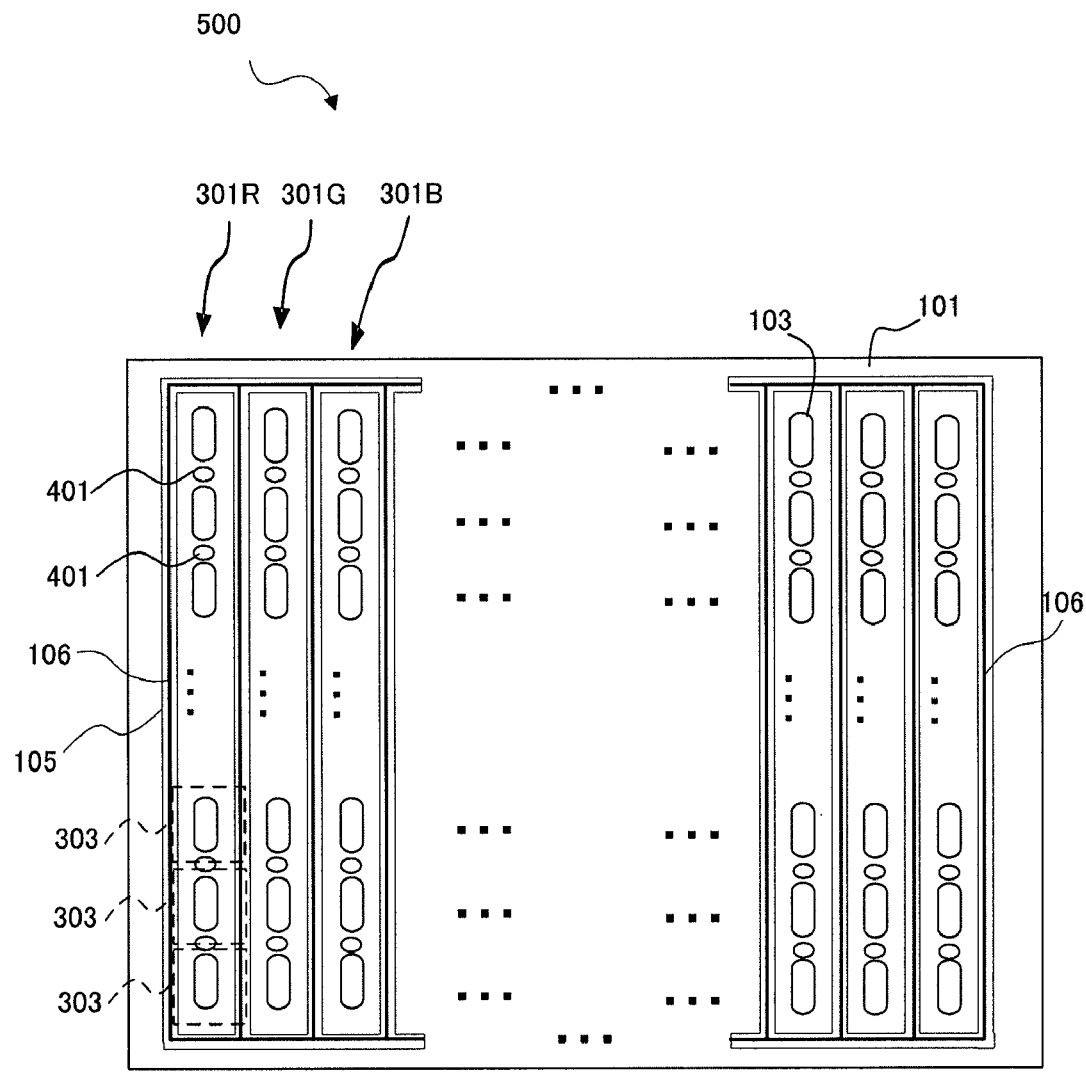
FIG. 10 is a plane view of the organic EL display panel of the Embodiment 5.

FIG. 10 is a plane view of organic EL display panel 500 of Embodiment 5 in which the cathode, the organic emitting layer, the intermediate layer and the hole injection layer were omitted. Organic EL display panel 500 is the same as organic EL display panel 400 of Embodiment 4 excepting that organic EL display panel 500 has an inorganic film 401. Therefore, the same symbols as those of organic EL display panel 400 are attached to the constitutional elements excepting an inorganic film 401, and the explanations of the elements will be omitted.

As shown in FIG. 10, between anode 103 and anode 103 in color-producing region 301, an inorganic film 401 is arranged. Examples of the materials of an inorganic film include silicon, silicon oxide, silicon nitride, silicon oxynitride and the like. In addition, the materials of the inorganic film may be the same as that of anode 103. Moreover, the inorganic film 401 is not connected to the driving TFT.

By arranging the inorganic film 401 consisting of the same material as that of cathode 103 between cathodes 103, it is possible to uniform the wettability in color-producing region 301. As a result, the film thickness of the organic emitting layer applied to the color-producing region can be uniform.

As seen above, according to this embodiment, in addition to the effect of Embodiment 3, it is possible to make the film thickness of the organic emitting layer formed in the color-producing region more uniform.

Embodiment 6

In Embodiments 4 and 5, an organic EL display panel in which all the pixels of the organic EL display panel produce luminescence was explained. In Embodiments 6, an example in which a part of plural pixels of the organic EL display panel is intentionally prevented from producing luminescence will be explained.

Figure 11:
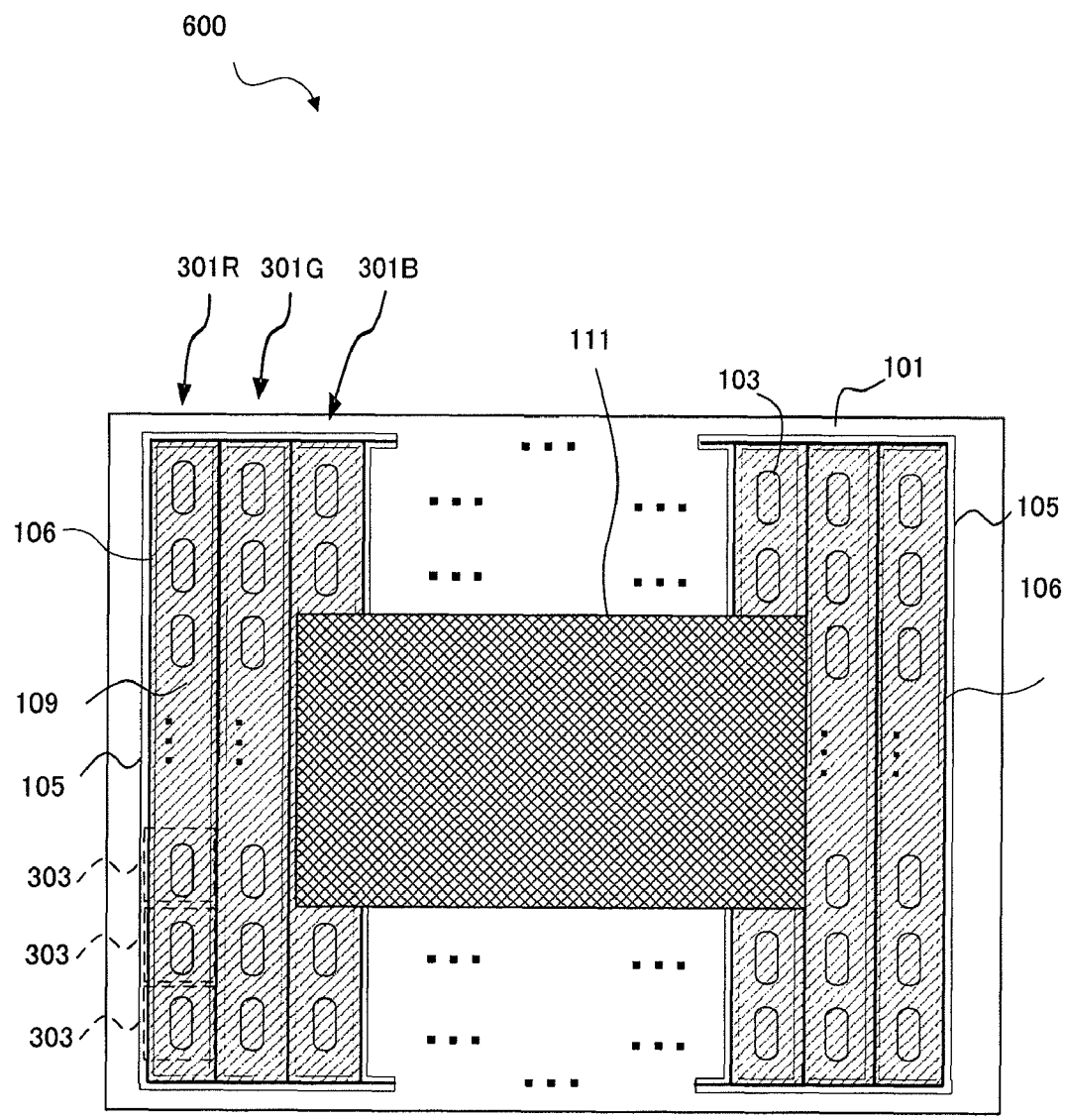
FIG. 11 is a plane view of the organic EL display panel of the Embodiment 6.

FIG. 11 is a plane view of organic EL display panel 600 according to Embodiments 6. As shown in FIG. 11, the organic EL display panel comprises cathode 111, bank 105 of a line shape and emitting layer 109 of a line shape. The plane view of organic EL display panel 600 in which the cathode, the organic emitting layer, the intermediate layer and the hole injection layer are omitted is the same as that of organic EL display panel 400 of Embodiment 4. Therefore, FIG. 9B is a plane view of organic EL display panel 600 in which the cathode, the organic emitting layer, the intermediate layer and the hole injection layer are omitted.

As shown in FIG. 11, in this embodiment, cathode 111 is not arranged on a part of pixel 303. More specifically, cathode 111 is not arranged on pixel 303 at the periphery of organic EL display panel 600. Since pixel 303 having no cathode does not produce luminescence, organic EL display panel 600 has pixel (hereinafter referred to as "the dummy pixel") which do not produce luminescence at the periphery. As the dummy pixel does not produce luminescence, it is not necessary to be connected to the driving TFT.

By providing, at the periphery of the organic EL display panel, the dummy pixel having the same structure as the pixel that produce luminescence, and by arranging the organic emitting layer on the dummy pixel, an evenly colored organic EL device display panel can be obtained. The relationship between the provision of the dummy pixel and the disappearance of color heterogeneity of the organic EL display panel is explained below.

In the organic EL device display panel of the invention, the organic emitting layer is formed by the coating method. In the case when a solution of the organic emitting material is applied to each pixel of the organic EL device display panel, the rate of drying of the solution of the organic emitting material is different depending on the position of the pixel. Namely, at the pixel at the periphery of the organic EL display panel, the rate of drying of the liquid of the organic emitting material is greater than that at the pixel in the center part of the organic EL device display panel. Therefore, there may be a case that the film thickness of the organic emitting layer of the pixel at the periphery of the organic EL display panel is different from that of the organic emitting layer of the pixel in the central part of the organic EL display panel. The difference of the film thickness of the organic emitting layer among the pixels results in the color heterogeneity.

However, in the case when the pixels at the periphery of the organic EL display are dummy pixels as in this invention, the pixels in the central part of the display whose organic emitting layers are identical shape produce luminescence. Thus, an organic EL display panel without color heterogeneity can be provided.

Embodiment 7

In Embodiments 4 to 6, an example in which the bank of a line shape defines the color producing region consisting of a plurality of pixels was explained. In Embodiment 7, an organic EL display panel in which the bank defines the organic emitting layer of each pixel is explained.

Figure 12:
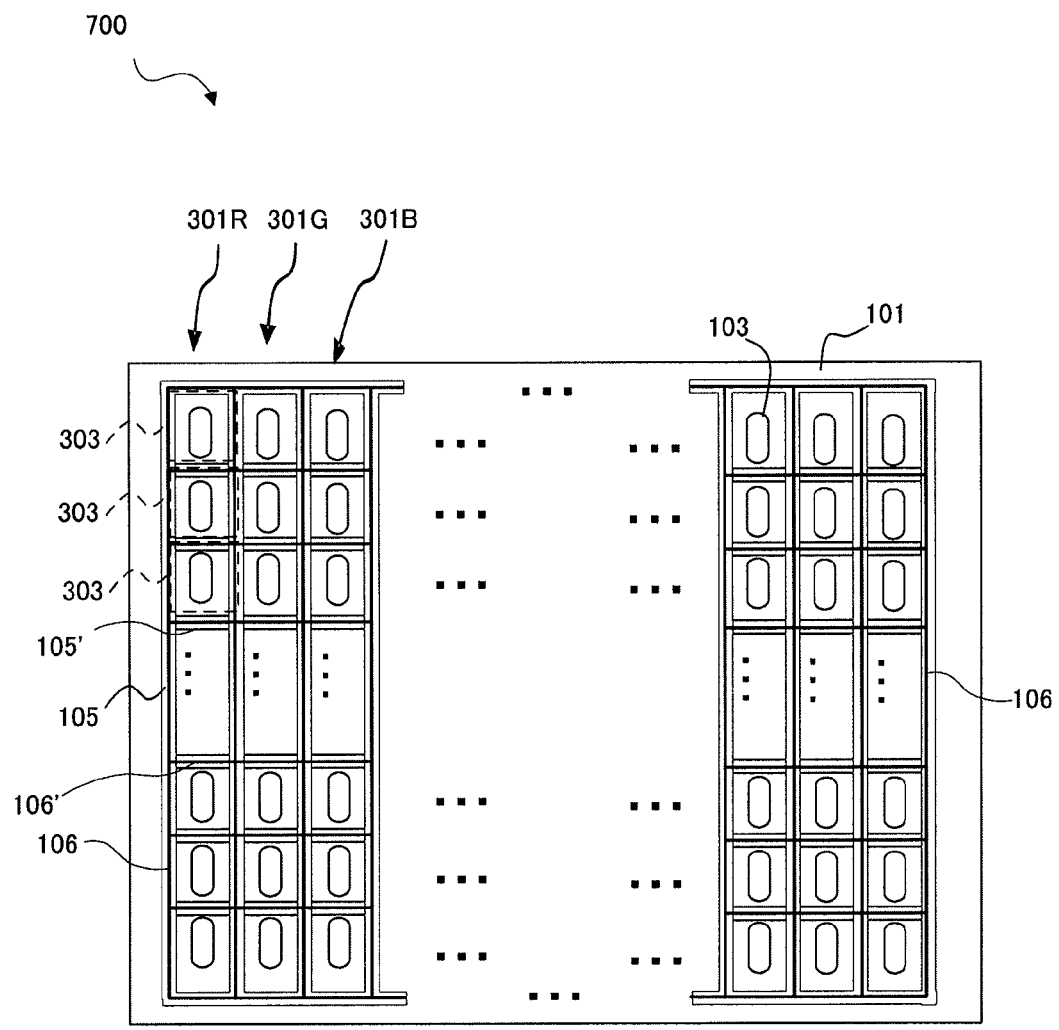
FIG. 12 is a plane view of the organic EL display panel of the Embodiment 7.

FIG. 12 is a plane view of organic EL display panel 700 in which the cathode, the organic emitting layer, the intermediate layer and the hole injection layer are omitted. Organic EL display panel 700 is the same as organic EL display panel 400 excepting that organic EL display panel 700 has second bank 105'. Therefore, the explanation for the constitutional elements other than second bank 105' will be omitted.

As shown in FIG. 12, second bank 105' defines a plurality of pixels 303 in color producing region 301 defined by bank 105 of a line shape. The material and the height of second bank 105' may be the same as those of bank 105. In addition, on the top face of second bank 105', groove 106' is formed similar to bank 105.

In this embodiment, the solution of the organic emitting material is applied to the region defined by bank 105 and second bank 105'. Therefore, in this embodiment, the organic emitting layer is arranged independently by pixel 303.

As seen above, in this embodiment, since the bank defines the organic emitting layer of each pixel, it is possible to control the convection flow of the applied ink containing the organic emitting material.

Embodiment 8

In Embodiment 7, an example in which the second bank defines each pixel was explained. In this embodiment, an example in which the second bank has a groove in communication with the neighboring pixels is explained.

Figure 13:
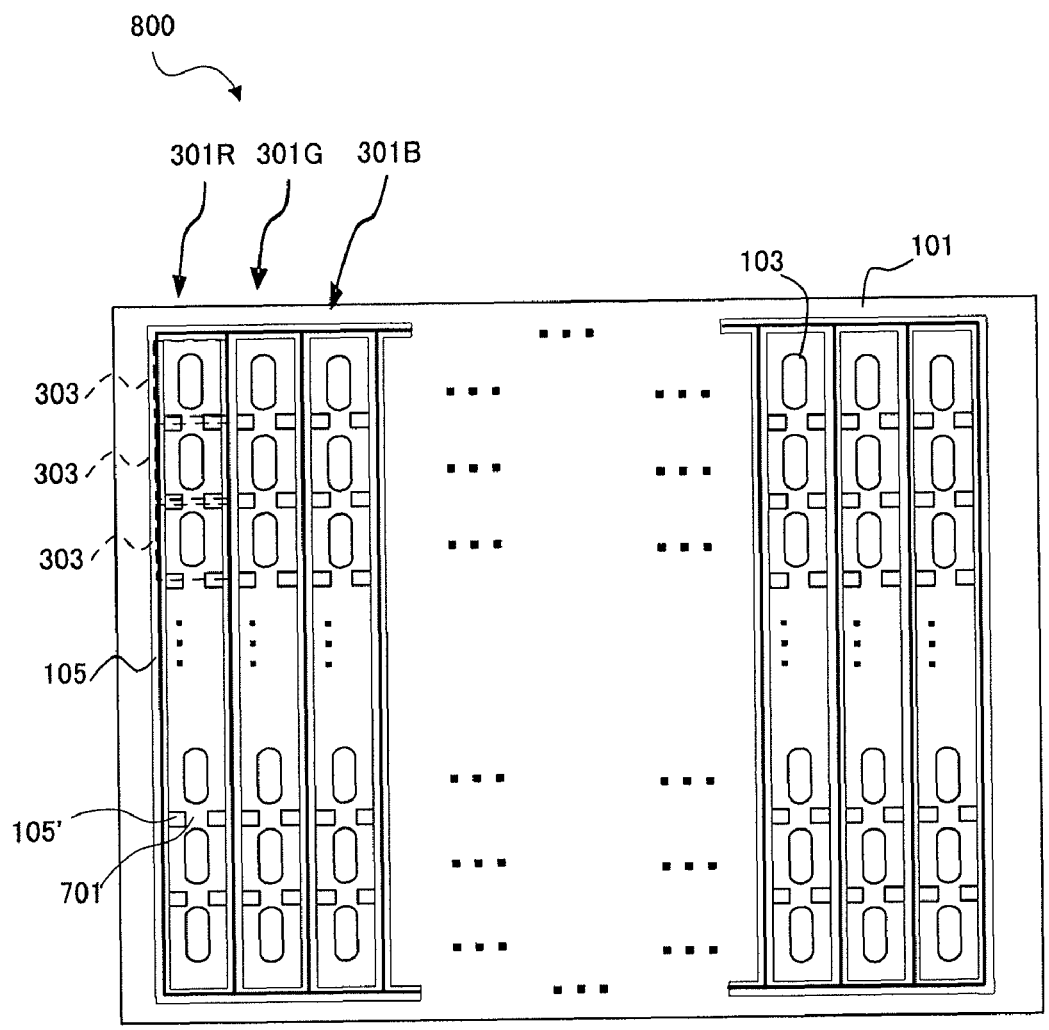
FIG. 13 is a plane view of the organic EL display panel of the Embodiment 8.

FIG. 13 is a plane view of the organic EL display panel in which the cathode, the organic emitting layer, the intermediate layer and the hole injection layer are omitted. Organic EL display panel 800 is the same as organic EL display panel 700 in Embodiment 7 excepting that second bank 105' has a groove in communication with between pixels 303. Therefore, the explanation excepting second bank 105' will be omitted.

As shown in FIG. 13, second bank 105' has groove 701 in communication with between pixels 303 which are neighbored each other in a line shape 301. In the case when second bank 105' has groove 701 in communication with between pixels 303, when the solution of the organic emitting material is applied to pixel 303, the solution of the organic emitting material can move between pixels 303, and as a result the film thickness in color producing region 301 becomes uniform. In addition, in this embodiment, second bank 105' may not have the groove 106 on the top face.

As seen above, according to this embodiment, in addition to the effect of Embodiment 7, the thickness of the organic emitting layer in the color producing region can be made uniform. In addition, before the organic emitting layer is formed, even when dusts and the like are attached in the color producing region, the production yield is increased, because the second bank prevents the ink containing the organic emitting material from being attracted by the dust.

This application claims priority based on Japanese Patent Application 2007-339168, Japanese Patent Application 2007-339169 and Japanese Patent Application 2007-339165 filed on Dec. 28, 2007, and Japanese Patent Application 2008-077310, Japanese Patent Application 2008-077311 and Japanese Patent Application 2008-077312 filed on Mar. 25, 2008. The disclosures in the descriptions of the above applications are incorporated herein by reference in their entireties

INDUSTRIAL APPLICABILITY

The organic EL device of the invention can be applied to the organic EL display (the wide-screen TV, the terminal monitoring of the information equipment such as a mobile).

The invention claimed is:
1. An active-matrix organic EL device, comprising:
a substrate;
an anode on the substrate;
an organic emitting layer on the anode;
a bank defining an arrangement region of the organic emitting layer, the bank comprising a fluorine containing resin; and a cathode covering the bank, wherein
a fluorine concentration of the fluorine containing resin gradually increases from a bottom face to a top face of the bank,
a groove, along an edge of the arrangement region of the organic emitting layer, is on the top face of the bank, and
a border of a top surface of the organic emitting layer meets an edge of the groove.

2. The organic EL device according to claim 1, wherein a width of the groove on the top face of the bank is from 10 to 100 μm and the depth is from 0.1 to 2.0 μm.

3. The organic EL device according to claim 1, wherein a distance from the bottom face of the bank to the top face of the bank is from 0.1 to 2.0 μm.

4. The organic EL device according to claim 1, wherein a thickness of the organic emitting layer is from 50 to 100 nm.

5. The organic EL device according to claim 1, further comprising an intermediate layer between the anode and the organic emitting layer, a border of the intermediate layer being defined by the groove.

6. The organic EL device according to claim 5, wherein the groove defining the border of the organic emitting layer and the groove defining the border of the intermediate layer are the same.

7. The organic EL device according to claim 5, wherein at least two grooves are formed on the top face of the bank, and the groove defining the border of the organic emitting layer and the groove defining the border of the intermediate layer are different.

8. The organic EL display panel comprising at least two organic EL devices according to claim 1 arranged on a same flat face, wherein:
the bank defines a line shaped region; and
in the line shaped region, at least two organic EL devices are arranged in a line.

9. An organic EL display panel comprising at least two organic EL devices according to claim 1 arranged on a same flat face, wherein:
the bank defines the organic emitting layer of each organic EL device, respectively.

10. A manufacturing method of the organic EL device according to claim 1, comprising:
forming the anode on the substrate;
forming the fluorine containing bank on the substrate such that at least a part of the anode is exposed;
forming the groove on the top face of the bank;
forming the organic emitting layer on the anode by coating an ink containing an organic emitting material in a region defined by the bank, and;
forming the cathode on the organic emitting layer.

11. The manufacturing method of an organic EL device according to claim 10, wherein:
the ink containing the organic emitting material is applied up to one of an inner edge and an outer edge of the groove when coating the ink containing the organic emitting material in the region defined by the bank.

* * * * *